United States Patent
Wei

[19]

[11] Patent Number: 6,025,245
[45] Date of Patent: Feb. 15, 2000

[54] METHOD OF FORMING A TRENCH CAPACITOR WITH A SACRIFICIAL SILICON NITRATE SIDEWALL

[75] Inventor: Houng-Chi Wei, I-Lan, Taiwan

[73] Assignee: Mosel Vitelic Inc., Hsinchu, Taiwan

[21] Appl. No.: 09/313,668

[22] Filed: May 18, 1999

[30] Foreign Application Priority Data

May 7, 1999 [TW] Taiwan .................................. 88107497

[51] Int. Cl.$^7$ ................................................ H01L 21/8242
[52] U.S. Cl. ........................... 438/386; 438/243; 438/247
[58] Field of Search ..................................... 438/210, 253, 438/254, 255, 256, 396, 397, 398, 399, 648, 387, 386, 744, 724, 757, 243; 257/306, 301

[56] References Cited

U.S. PATENT DOCUMENTS

| | | | |
|---|---|---|---|
| 4,859,615 | 8/1989 | Tsukamoto et al. | 438/247 |
| 5,545,583 | 8/1996 | Lam et al. | 438/386 |
| 5,719,080 | 2/1998 | Kenney | 438/243 |

*Primary Examiner*—Tom Thomas
*Assistant Examiner*—Belur Keshavan
*Attorney, Agent, or Firm*—Harold L. Novick; Nath & Associates

[57] ABSTRACT

The present invention provides a method of forming trench capacitor with a sacrificial silicon nitride. A deep trench structure is formed in a substrate. A TEOS oxide layer is formed on the substrate and filled in said trench region, etched to a first level subsequently, wherein a portion of the TEOS oxide layer is remained in the trench region and a portion of the substrate exposed to form a trench sidewall. A thermally oxidation process is performed to form a collar oxide on the exposed substrate. A silicon nitride sidewall is formed on the collar oxide, then removing the residual TEOS oxide layer by wet etching. A bottom cell plate is formed in the lower trench region. The silicon nitride sidewall is removed. A dielectric film is formed along a surface of the bottom cell plate, the collar oxide, and the substrate, subsequently, a first conductive layer is formed on said dielectric film and refill in the trench region. The first conductive layer and the dielectric film are etched to the first level to expose a portion of the collar oxide, the exposed portion of the collar oxide is then etched by wet etching. A second conductive layer is formed on the first conductive layer and etched back to form a buried strap in the trench region.

20 Claims, 3 Drawing Sheets

METHOD OF FORMING A TRENCH CAPACITOR WITH A SACRIFICIAL SILICON NITRATE SIDEWALL

FIELD OF THE INVENTION

The present invention relates to a trench capacitor, and more particularly, to a method of forming a trench capacitor with a sacrificial silicon nitride sidewall.

BACKGROUND OF THE INVENTION

Early DRAMs used storage cells each consisting of three transistors and were manufactured using P type channel metal-oxide-semiconductor (PMOS) technology. Later, a DRAM storage cell structure consisting of one transistor and one capacitor was developed. The gate of the transistor is controlled by a word line signal, and data, represented by the logic level of a capacitor voltage, is written into or read out of the capacitor through a bit line.

As the semiconductor memory device becomes more highly integrated, the area occupied by a capacitor of a DRAM storage cell typically shrinks. Thus, the capacitance of the capacitor is reduced owing to its smaller electrode surface area. However, a relatively large capacitance is required to achieve a high signal-to-noise ration in reading the memory cell and to reduce soft errors (due to alpha particle interference). Therefore, it is desirable to reduce the cell dimension and yet obtain a high capacitance, thereby achieving both high cell integration and reliable operation.

When DRAM cells are scaled down while maintaining the cell capacitance, three-dimensional cell structures, such as trench capacitors, are widely developed. One of advantages of the trench capacitor cell is its large capacitance and planar topography. One of the prior arts in accordance with the trench capacitor can be seen "A 0.6 $\mu m^2$ 256 Mb Trench DRAM Cell With Self-Aligned BuriEd STrap (BEST), L. Nesbit et al., 1993, IEEE, IEDM 93-627". A unique feature of this cell is a self-aligned buried strap that forms at the intersection of the storage trench and the junction of the array device. However, it is difficult to make deep trenches with a high aspect ratio for high density DRAMs.

An example of a conventional deep trench capacitor is depicted in FIG. 1A to FIG. 1C. Referring to FIG. A, that shows a dielectric layer 102 is formed on a semiconductor substrate 101, and a trench region 100 is formed by dry etching down. After the trench is etched, the N-type capacitor plate 103 is formed by outdiffusing arsenic or phosphoric from the lower portion of the trench. An oxidized nitride (NO) storage node dielectric 104 is formed in the storage trench, followed by the deposition and controlled recess of a first trench fill of n+ polysilicon 105. See FIG. 1B, a collar oxide 106 is formed using conventional CVD process. The depth of buried strap is defined by a controlled etchback of a second polysilicon trench fill 107 and the removal of the exposed collar oxide. A third polysilicon film 108, which contacts the silicon substrate along the exposed trench sidewall, is deposited and recessed below the silicon substrate surface.

SUMMARY OF THE INVENTION

The object of the present invention is to provide an improved method of forming a trench capacitor.

The other object of the present invention is to provide a method of forming a trench capacitor with a sacrificial silicon nitride sidewall to protect a collar oxide.

A first silicon nitride layer and a thick oxide layer are formed on a silicon substrate, then pattern said first silicon nitride layer and said thick oxide layer to form a deep trench region in said substrate. Subsequently, said thick oxide layer is removed away by wet etching. A TEOS oxide layer is formed on said first silicon nitride layer and filled in said trench region by conventional process. The TEOS oxide layer is etched to a first level by dry etching, wherein a portion of the TEOS oxide layer is remained in the trench region and a portion of the silicon substrate exposed in the trench region. A thermally oxidation process is performed to form a collar oxide on the exposed silicon substrate. A second silicon nitride layer is formed on the first silicon nitride layer, the collar oxide, and the residual TEOS oxide layer. The second silicon nitride layer is etched anisotropically to form a silicon nitride sidewall on said collar oxide, subsequently, removing the residual TEOS oxide layer by wet etching.

A dopant layer is formed in the lower trench region for doping ions over the lower trench region to form a bottom cell plate. The silicon nitride sidewall is removed. A dielectric film is formed on the bottom cell plate, the collar oxide, and the first silicon nitride layer, subsequently, a first conductive layer is formed on said dielectric film. The first conductive layer and the dielectric film are etched to a second level to expose a portion of the collar oxide, the exposed portion of the collar oxide is then etched by wet etching. A second conductive layer is formed on the first conductive layer and etched back to form a buried strap in the trench region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention provides an improved method for forming a trench capacitor with a sacrificial silicon nitride sidewall. A trench capacitor constructed in accordance with the present invention is depicted in FIGS. 2–6.

Figure 1A:
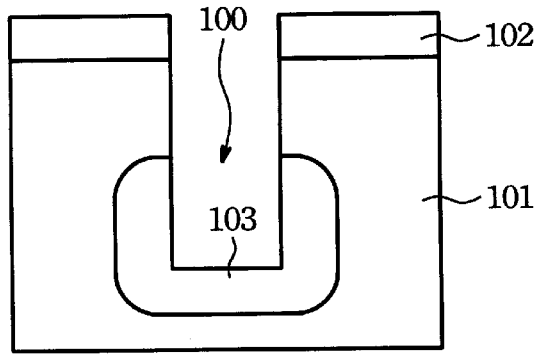
FIG. 1A is a cross-sectional view of a semiconductor wafer illustrating the steps of forming a trench structure on a semiconductor substrate by conventional processes.
Figure 1B:
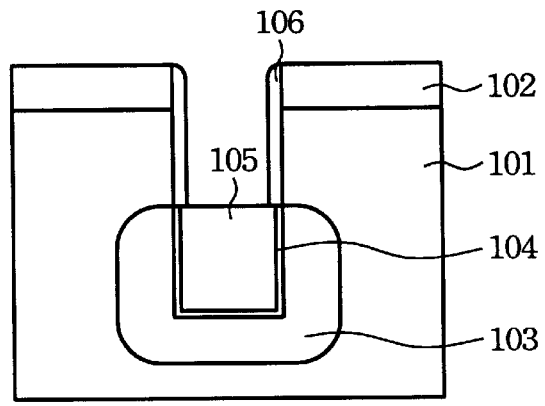
FIG. 1B is a cross-sectional view of a semiconductor wafer illustrating the steps of forming a collar oxide on the trench sidewall by conventional processes.
Figure 1C:
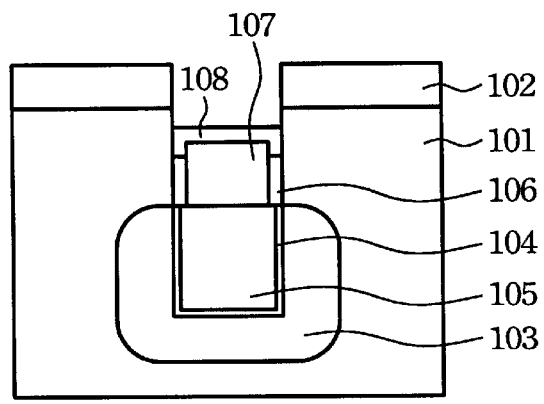
FIG. 1C is a cross-sectional view of a semiconductor wafer illustrating the steps of forming a buried strap in the trench structure by conventional processes.
Figure 2:
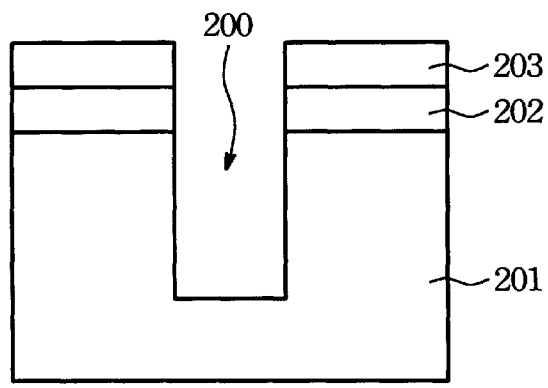
FIG. 2 is a cross-sectional view of a semiconductor wafer illustrating the step of forming a deep trench region on the semiconductor substrate.

Referring to FIG. 2, a single crystal P-type silicon substrate 201 with a <100> crystallographic orientation is used for the preferred embodiment. A silicon nitride layer 202, has a thickness about 2000 to 2500 Å, is formed on the silicon substrate 201 using a conventional low pressure chemical vapor deposition (LPCVD) or plasma enhanced chemical vapor deposition (PECVD). A thick oxide layer 203 with a thickness about 7000 to 8000 Å is then formed and patterned on the silicon nitride layer 202 to define a deep trench region 200, which is formed by dry etching down to a predeterminate depth into the P-type silicon substrate. The deep trench region has a depth about 7.0 to 8.0 $\mu$m and a width about 0.2 to 0.4 $\mu$m. In this embodiment, the etching process for forming the deep trench region 200 is preferably done by a standard plasma dry etch method or a reactive ion etch (RIE), which are conventional and well known, so that the processes are not particularly germane to the present invention. The thick oxide layer 203 is then removed away by wet etching.

Figure 3:
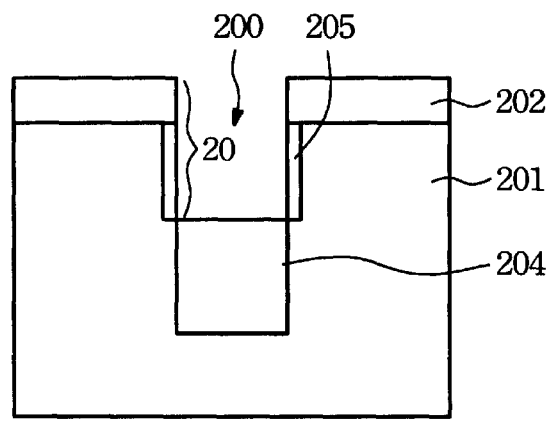
FIG. 3 is a cross-sectional view of a semiconductor wafer illustrating the step of forming a thermal collar oxide in the trench region.

Referring now to FIG. 3, a tetraethylorthosilicate (TEOS) oxide layer 204 is formed in the deep trench region 200 and on the silicon nitride layer 202. The TEOS oxide layer 204 is recess etched to a first level 20, which has a depth of about 1.3 to 1.6 $\mu$m. In this etching, a portion of silicon substrate 201 is exposed in the deep trench region 200 to form a trench sidewall. A thermally oxidation is performed to form a collar oxide 205 on the exposed silicon substrate 201. The reaction temperature of the thermally oxidation is about 900 to 1050° C. and the collar oxide has a width about 40 to 50 nm.

Figure 4:
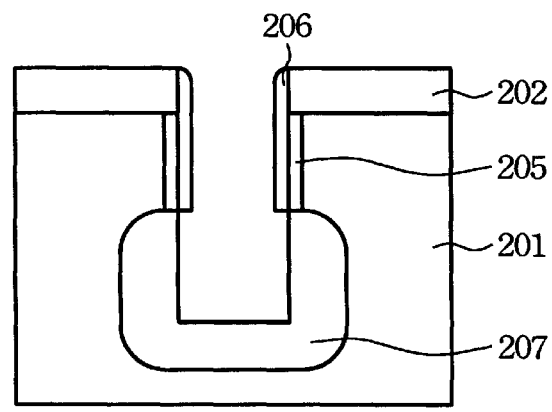
FIG. 4 is a cross-sectional view of a semiconductor wafer illustrating the step of forming a sacrificial silicon nitride sidewall and a N-type bottom conductive plate in the trench region.

FIG. 4 shows that a thin silicon nitride layer is formed along a surface of the silicon nitride layer 202, the collar oxide 205 and the TEOS oxide layer 204. A silicon nitride sidewall 206 is formed by using a spacer etching technique. The silicon nitride sidewall 206, has a width about 10 to 12 nm, prevents the covered areas from being oxidized, doped and etched. The TEOS oxide layer 204 is then removed by using a BOE (buffer oxide etching) solution or a diluted HF solution. A N-type bottom plate 207 is formed in the P-type silicon substrate 201 by covering the freshly excavated trench with a thin layer of arsenic doped TEOS or phosphoric doped TEOS and allowing the N-type dopant to partially diffuse into the P-type silicon substrate by annealing. The doped TEOS layer and the silicon nitride sidewall 206 are then removed away by wet etching. The silicon nitride sidewall 206 is stripped away using hot phosphorus acid solution ($H_3PO_4$). Vapor-phase phosphorus doping also can form the N-type bottom plate, which is formed on the lower portion of the deep trench region 200.

Figure 5:
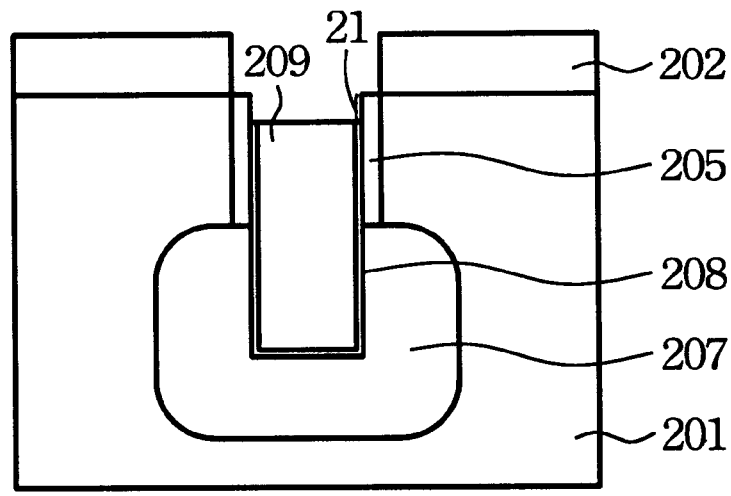
FIG. 5 is a cross-sectional view of a semiconductor wafer illustrating the step of forming a dielectric film and a conductive layer in the deep trench region.

Next referring to FIG. 5, a dielectric film 208 of the trench capacitor is conformably deposited along the surface of the silicon nitride layer 202, the collar oxide 205 and the N-type bottom plate 207. Typically, the dielectric film 208 is preferably formed of either a double film of nitride/oxide (NO) film, a triple film of oxide/nitride/oxide (ONO), or any other high dielectric film such as tantalum oxide ($Ta_2O_5$), BST, PZT, PLZT. In the preferred embodiment, stacked nitride-oxide (NO) film is used as the material of the dielectric film 208. As is known in the art of DRAM capacitor fabrication, the NO film is reliable over silicon surface, and is typically used as a capacitor insulator. A first conductive layer 209 is deposited on the dielectric film 208 and refilled into the deep trench region 200 using a conventional LPCVD process. The first conductive layer 209 is preferably either doped polysilicon or in-situ doped polysilicon. The first conductive layer 209 is recess etched to the second level 21, which has a depth of about 280 to 310 nm. So that a portion of the dielectric film 208 is exposed and then etched by wet etching.

Figure 6:
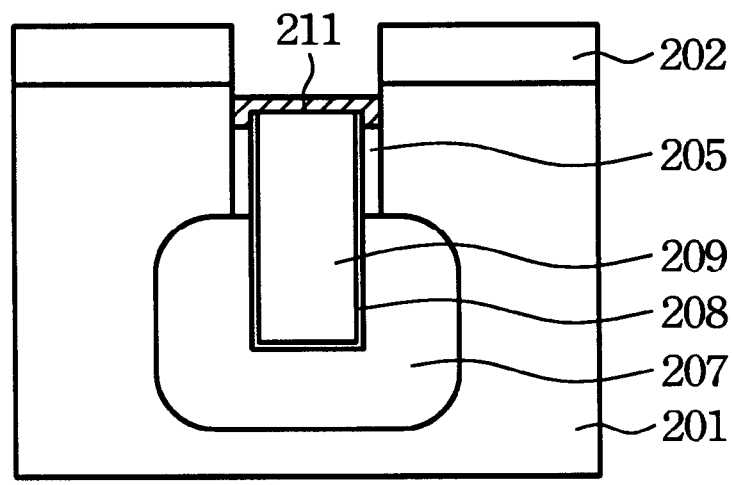
FIG. 6 is a cross-sectional view of a semiconductor wafer illustrating the step of forming a buried strap in the deep trench region.

Referring to FIG. 6, after the exposed dielectric film is striped a portion of the collar oxide 205 is exposed. The exposed collar oxide is stripped away using conventional wet etching, wherein the wet etching has a high susceptibility to the collar oxide. A second conductive layer 211 is deposited on the first conductive layer 209, and is then etched back to a third level for forming a buried strap 211. The third level is below the surface of the silicon substrate. Thus the buried strap forms without using a separate mask. The second conductive layer is preferably either doped polysilicon or in-situ doped polysilicon.

The present invention provides a method of forming a trench capacitor with a sacrificial silicon nitride sidewall, in this work, we present a simple process to fabricate a self-aligned buried strap and a sacrificial silicon nitride sidewall to protect the collar oxide from wet etching. These technologies provide a trench capacitor with high capacitance and good performance.

As is understood by a person that skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method of forming a trench capacitor with a sacrificial silicon nitride sidewall, said method comprising the steps of:

patterning a silicon substrate to form a trench region in said substrate;

forming a silicon oxide layer on said silicon substrate and filling in said trench region;

etching said silicon oxide layer to a first level, wherein a portion of said silicon oxide layer is remained in said trench region and a portion of said silicon substrate is exposed to form a trench sidewall;

forming a collar oxide on said trench sidewall;

forming a silicon nitride sidewall on said collar oxide;

removing said residual silicon oxide layer;

doping ions over said trench region to form a bottom cell plate;

removing said silicon nitride sidewall;

forming a dielectric film along a surface of said bottom cell plate, said collar oxide, and said silicon substrate;

forming a first conductive layer on said dielectric film and refilling in said trench region; and etching said first conductive layer to a second level to form a storage node of said trench capacitor and exposing a portion of said collar oxide.

2. The method according to claim 1, further comprising the steps of forming a buried strap after etching said first conductive layer, said method comprising the steps of:

etching said exposed dielectric film and portion of said collar oxide;

forming a second conductive layer on said first conductive layer; and etching back said second conductive layer to a third level.

3. The method according to claim 2, wherein said second conductive layer is selected from the group of doped polysilicon and in-situ doped polysilicon.

4. The method according to claim 2, wherein said third level is below a top surface of said silicon substrate.

5. The method according to claim 1, wherein said silicon oxide layer is formed of TEOS oxide.

6. The method according to claim 1, wherein said collar oxide is formed by thermal oxidation.

7. The method according to claim 1, wherein said step of doping ions is performed by vapor-phase doping.

8. The method according to claim 1, wherein said step of doping ions is performed by thermal diffusing.

9. The method according to claim 1, wherein said doping ions is selected from the group of arsenic and phosphoric ions.

10. The method according to claim 1, wherein said dielectric film is selected from the group of NO, ONO, $Ta_2O_5$, BST, PZT, and PLZT.

11. The method according to claim 1, wherein said first conductive layer is selected from the group of doped polysilicon and in-situ doped polysilicon.

12. The method according to claim 1, wherein said silicon nitride sidewall has a width about 10 to 12 nm.

13. A method of forming a trench capacitor with a sacrificial silicon nitride sidewall, said method comprising the steps of:

patterning a silicon substrate to form a trench region in said substrate;

forming a silicon oxide layer on said silicon substrate and filling in said trench region;

etching said silicon oxide layer to a first level, wherein a portion of said silicon oxide layer is remained in said trench region and a portion of said silicon substrate is exposed to form a trench sidewall;

forming a thermal collar oxide on said trench sidewall;

forming a silicon nitride layer along a surface of said silicon substrate, said collar oxide, and said residual silicon oxide layer;

etching said silicon nitride layer to form a silicon nitride sidewall on said collar oxide;

removing said residual silicon oxide layer;

doping ions over said trench region to form a bottom cell plate;

removing said silicon nitride sidewall;

forming a dielectric film along a surface of said bottom cell plate, said collar oxide, and said silicon substrate;

forming a first conductive layer on said dielectric film and refilling in said trench region;

etching said first conductive layer to a second level to form a storage node of said trench capacitor and exposing a portion of said collar oxide;

wet etching said exposed dielectric film and portion of said collar oxide;

forming a second conductive layer on said first conductive layer; and etching back said second conductive layer to a third level to form a buried strap in said trench region.

14. The method according to claim 13, wherein said silicon oxide layer is form of TEOS.

15. The method according to claim 13, wherein said step of doping ions is performed by vapor-phase doping.

16. The method according to claim 13, wherein said step of doping ions is performed by thermal diffusing.

17. The method according to claim 13, wherein said doping ions is selected from the group of arsenic and phosphoric ions.

18. The method according to claim 13, wherein said dielectric film is selected from the group of NO, ONO, $Ta_2O_5$, BST, PZT, and PLZT.

19. The method according to claim 13, wherein said silicon nitride sidewall has a width about 10 to 12 nm.

20. The method according to claim 13, wherein said third level is below a top surface of said silicon substrate.

* * * * *